United States Patent [19]

Matsuura et al.

[11] Patent Number: 5,465,049
[45] Date of Patent: Nov. 7, 1995

[54] INTEGRATED TYPE PLANAR MAGNETIC SENSOR HAVING SQUID AND FLUX TRANSFORMER FORMED OF OXIDE SUPERCONDUCTOR

[75] Inventors: Takashi Matsuura; Hideo Itozaki, both of Hyogo, Japan

[73] Assignee: Sumitomo Electric Industries, Ltd., Osaka, Japan

[21] Appl. No.: 48,197

[22] Filed: Apr. 20, 1993

[30] Foreign Application Priority Data

Apr. 20, 1992 [JP] Japan ................................ 4-126862

[51] Int. Cl.$^6$ ............................................... G01R 33/035
[52] U.S. Cl. .................... 324/248; 336/84 M; 505/846; 324/262
[58] Field of Search ................................ 324/248, 260, 324/262, 239; 336/84 C, 84 M, 84 R; 505/702, 776–785, 842–846

[56] References Cited

U.S. PATENT DOCUMENTS

| | | | |
|---|---|---|---|
| 4,064,029 | 12/1977 | Wu et al. | 324/248 X |
| 4,491,795 | 1/1985 | Gelinas | 324/248 |
| 5,053,834 | 10/1991 | Simmonds | 324/248 X |
| 5,166,614 | 11/1992 | Yokosawa et al. | 324/248 |
| 5,173,660 | 12/1992 | Marsden | 324/248 |
| 5,218,297 | 6/1993 | Nakane et al. | 324/248 |
| 5,311,020 | 5/1994 | Silver et al. | 250/338.4 |

FOREIGN PATENT DOCUMENTS

| | | |
|---|---|---|
| 0327123 | 8/1989 | European Pat. Off. . |
| 0399499 | 11/1990 | European Pat. Off. . |
| 0479209 | 4/1992 | European Pat. Off. . |
| 0483784 | 5/1992 | European Pat. Off. . |
| 210129 | 1/1983 | German Dem. Rep. . |
| WO-A-9212436 | 7/1992 | WIPO . |

OTHER PUBLICATIONS

Ketchen et al., "Shielded Thin Film SQUID System", IBM Technical Disclosure Bulletin, vol. 25, No. 1, Jun. 1982, New York, pp. 45–47.

Chinone et al., "An Integrated DC SQUID Gradiometer for Biomagnetic Application", Systems and Computers in Japan, vol. 22, No. 4, 1991, New York, pp. 88–97.

Hammond, R. B. et al.; "Epitaxial Tl2CaBa2Cu2O8 thin films with low 9.6 Ghz surface resistance at high power and above 77 K"; Applied Physics Letters, vol. 57, No. 8, Aug. 20, 1990, N.Y., pp. 825–827.

McAvoy, R. R. et al.; "Superconducting stripline resonator performance"; IEEE Transactions on Magnetics; vol. 25, No. 2, Mar. 1989, New York, pp. 1104–1106.

Inam, A. et al.; "Microwave properties of highly oriented YBa2Cu3O7-x thin films"; Applied Physics Letters; vol. 56, No. 12, Mar. 19, 1990, New York, pp. 1178–1180.

Rensch, D. B. et al.; "Fabrication and characterization of high–Tc superconducting X–band resonators and bandpass filters"; IEEE Transactions on Magnetics; vol. 27, No. 2, Mar. 1991; N.Y.; pp. 2553–2556.

Withers, R. S. et al.; "High–Tc Superconducting Thin Films for Microwave Applications"; Solid State Technology; vol. 33, No. 8, Aug. 1990, Tulsa, Okla., US; pp. 83–87.

Primary Examiner—Sandra L. O'Shea
Assistant Examiner—Warren S. Edmonds
Attorney, Agent, or Firm—Foley & Lardner

[57] ABSTRACT

A magnetism sensor is disclosed that includes a substrate, a SQUID including a washer of an oxide superconductor thin film formed on a principal surface of the substrate, a hole shaped a similar figure to the washer at the center of the washer, a slit formed between one side of the washer and the hole and a Josephson junction by which portions of the washer at the both sides of the slit are connected across the slit. The magnetism sensor further includes a superconducting flux transformer of an oxide superconductor thin film including an input coil arranged on the SQUID but isolated from the SQUID and a pickup coil arranged on the principal surface of the substrate far from the SQUID, which are connected in parallel and a magnetism shield which excludes flux penetrating into the Josephson junction of the SQUID.

11 Claims, 4 Drawing Sheets

INTEGRATED TYPE PLANAR MAGNETIC SENSOR HAVING SQUID AND FLUX TRANSFORMER FORMED OF OXIDE SUPERCONDUCTOR

BACKGROUND OF THE INVENTION

1. Field of the Invention

The present invention relates to a planar magnetism sensor utilizing a SQUID (Superconducting QUantum Interference Device) of an oxide superconductor, and more specifically to a sensitive planar magnetism sensor utilizing a SQUID of an oxide superconductor.

2. Description of Related Art

A SQUID is a sensitive magnetism sensor utilizing a Josephson junction, which is capable of measuring extremely weak flux less than flux quantum $\phi_0 (=h/2e$, h: Planck's constant, e: charge of an electron) by converting the flux into voltage. The SQUID has a superconducting loop and one or two Josephson junctions which are inserted to the superconducting loop. The SQUID which has one Josephson junction is called a RF-SQUID and the one which has two Josephson junctions is called a DC-SQUID.

When a SQUID is used for a magnetism sensor, the SQUID is usually associated with a superconducting flux transformer in order to increase its sensitivity. The superconducting flux transformer is constituted of two superconducting coils of different sizes connected in parallel, which are called a pickup coil and an input coil. The input coil is the smaller one which has a size close to that of the SQUID and is placed on the SQUID. The pickup coil is the larger one which detects flux and is arranged apart from the SQUID.

The flux detected by the pickup coil is concentrated to the input coil and the SQUID measures the concentrated flux. By this, the substantial sensitivity of the SQUID increases in relative to the self conductance ratio of the pickup coil to the input coil.

FIG. 1 shows a partial view of a conventional magnetism sensor utilizing a planar DC-SQUID, which is disclosed by M. B. Kechen et al. in Appl. Phys. Lett., 44, 736 (1982). In FIG. 1, the magnetism sensor includes a substrate 5, a SQUID 1 formed on the substrate 5 and a superconducting flux transformer of which input coil 3 is arranged on the SQUID 1. The SQUID 1 is mainly constituted of a washer 10 of a square superconducting thin film, which has a square hole 11 at the center. An input coil 3 of the superconducting flux transformer is placed on the washer 10 of the SQUID 1 but isolated from the SQUID 1.

The superconducting thin film of the washer 10 overlaps at a portion 19 and the overlap portion 19 is connected to the under layer through two Josephson junctions (not shown) connected in series. The washer 10 has two tongue portions 14 and 15, in order to connect the SQUID 1 to a signal processor (not shown).

The input coil 3 is formed of a helical rectangular shaped superconducting coil. The input coil 3 is connected to the pickup coil (not shown) of the superconducting flux transformer, which is formed on the substrate 5 far from the SQUID 1. Namely, the SQUID 1 and the pickup coil is arranged on the same plane. The SQUID 1 measures 100 µm square and the pickup coil measures 1 mm square.

Therefore, when a magnetic field is measured by using the above mentioned conventional planar magnetism sensor, flux penetrates not only the pickup coil but also the SQUID. The flux penetrating the Josephson junctions of the SQUID has adverse effect on the tunnel current flowing through the Josephson junction, so that the voltage generated by the SQUID decreases. The drop of the voltage can reduce substantial sensitivity of the magnetism sensor.

SUMMARY OF THE INVENTION

Accordingly, it is an object of the present invention to provide a high sensitive planar magnetism sensor utilizing a SQUID composed of an oxide superconductor material, which have overcome the above mentioned defects of the conventional ones.

Another object of the present invention to provide a planar magnetism sensor utilizing a SQUID which has a larger output voltage.

The above and other objects of the present invention are achieved in accordance with the present invention by a magnetism sensor comprising a substrate, a SQUID including a washer of an oxide superconductor thin film formed on a principal surface of the substrate, a hole shaped a similar figure to the washer at the center of the washer, a slit formed between one side of the washer and the hole and a Josephson junction by which portions of the washer at the both sides of the slit are connected across the slit, the magnetism sensor further comprising a superconducting flux transformer of an oxide superconductor thin film including an input coil arranged on the SQUID but isolated from the SQUID and a pickup coil arranged on the principal surface of the substrate far from the SQUID, which are connected in parallel and a magnetism shield which excludes flux penetrating into the Josephson junction of the SQUID.

In the magnetism sensor in accordance with the present invention, no flux penetrates the Josephson junction of the SQUID, so that the tunnel current flowing through the Josephson junction is not affected by the flux and output voltage of the SQUID is improved. Therefore, the sensitivity of the magnetism sensor in accordance with the present invention is substantially improved.

In a preferred embodiment, the magnetism shield of the magnetism sensor in accordance with the present invention is formed of an oxide superconductor thin film. In this case, when the magnetism sensor is cooled and the oxide superconductor thin films of the SQUID and the superconducting flux transformer are in the superconducting state, the magnetism shield of the oxide superconductor thin film is also in the superconducting state. Therefore, flux penetrating into the Josephson junction is excluded by the Meissner effect at the magnetic shield, so that the tunnel current flowing through the Josephson junction is not affected by the flux.

Preferably, the washer and the hole of the SQUID of the magnetism sensor in accordance with the present invention are rectangular. If their shapes have poor symmetry, the SQUID has an isotropic characteristics or sensitivity which will become an obstacle for the practical application. In this case, it is preferable that the input coil and the pickup coil of the superconducting flux transformer are rectangular.

According to the present invention, the Josephson junction of the SQUID of the magnetism sensor is of weak link type constituted of a grain boundary of the oxide superconductor. Since the weak link type Josephson junction can be easily formed without a extremely fine processing by utilizing a grain boundary of the oxide superconductor crystals, it is favorable that the Josephson junction of the SQUID of the magnetism sensor of the present invention is constituted of a grain boundary of the oxide superconductor.

In one preferred embodiment, the oxide superconductor thin films are formed of a high-$T_c$ (high critical temperature) oxide superconductor, particularly, formed of a high-$T_c$ copper-oxide type compound oxide superconductor for example a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate can be formed of a single crystal oxide substrate such as a MgO (100) substrate, a SrTiO$_3$ (110) substrate, an yttrium stabilized zirconia (YSZ) substrate, etc.

According to one preferred embodiment of the present invention, the magnetism sensor comprising a substrate having a rectangular parallelpipedic concavity on a surface, a SQUID including a square washer having two tongue portions of an oxide superconductor thin film formed on the surface of the substrate, a square hole at the center of the washer, a slit formed between the tongue portions to the hole, and a member of an oxide superconductor thin film including two Josephson junctions connected in series, which connects the two tongue portions across the slit, the magnetic sensor further including a superconducting flux transformer of an oxide superconductor thin film including a rectangular input coil arranged on the SQUID but isolated from the SQUID and a rectangular pickup coil arranged on the principal surface of the substrate far from the SQUID, which are connected in parallel and a magnetism shield which excludes flux penetrating into the Josephson junctions of the SQUID in which the Josephson junctions of the SQUID are constituted of grain boundaries of the oxide superconductor at steps between the surface of the substrate and the bottom of the concavity.

The above and other objects, features and advantages of the present invention will be apparent from the following description of preferred embodiments of the invention with reference to the accompanying drawings.

DESCRIPTION OF THE PREFERRED EMBODIMENTS

Figure 2A:
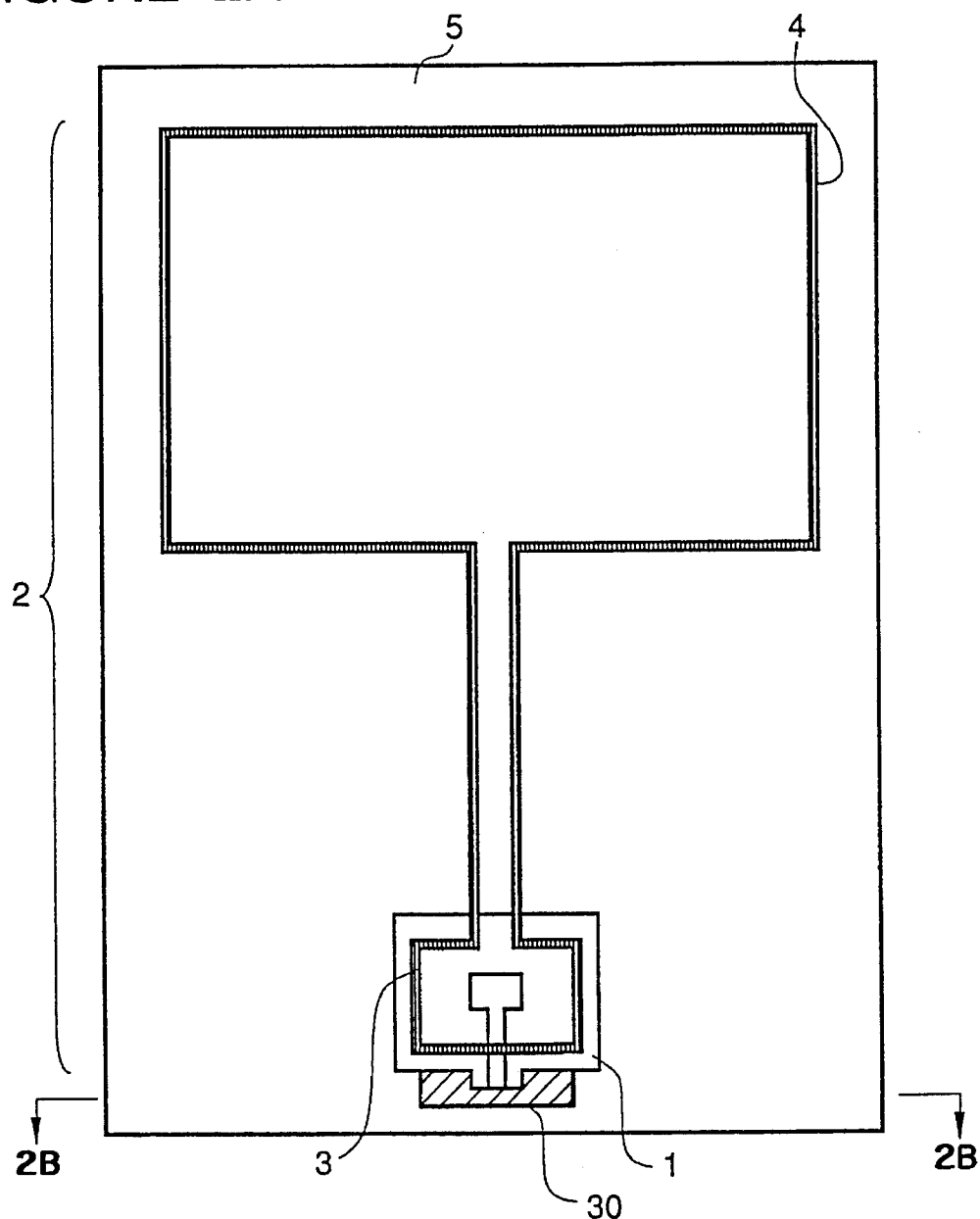
FIG. 2A is a diagrammatic plane view of a preferred embodiment of the planar magnetism sensor in accordance with the present invention.

FIG. 2A shows a diagrammatic plan view of an embodiment of the planar magnetism sensor in accordance with the present invention. The magnetism sensor includes an MgO (100) substrate 5, a DC-SQUID 1 of a c-axis orientated Y$_1$Ba$_2$Cu$_3$O$_{7-\delta}$ oxide superconductor thin film formed on the substrate 5, a superconducting flux transformer 2 of which an input coil 3 is arranged on the DC-SQUID 1 and a magnetism shield 30 which covers Josephson junctions of the DC-SQUID 1.

Figure 1:
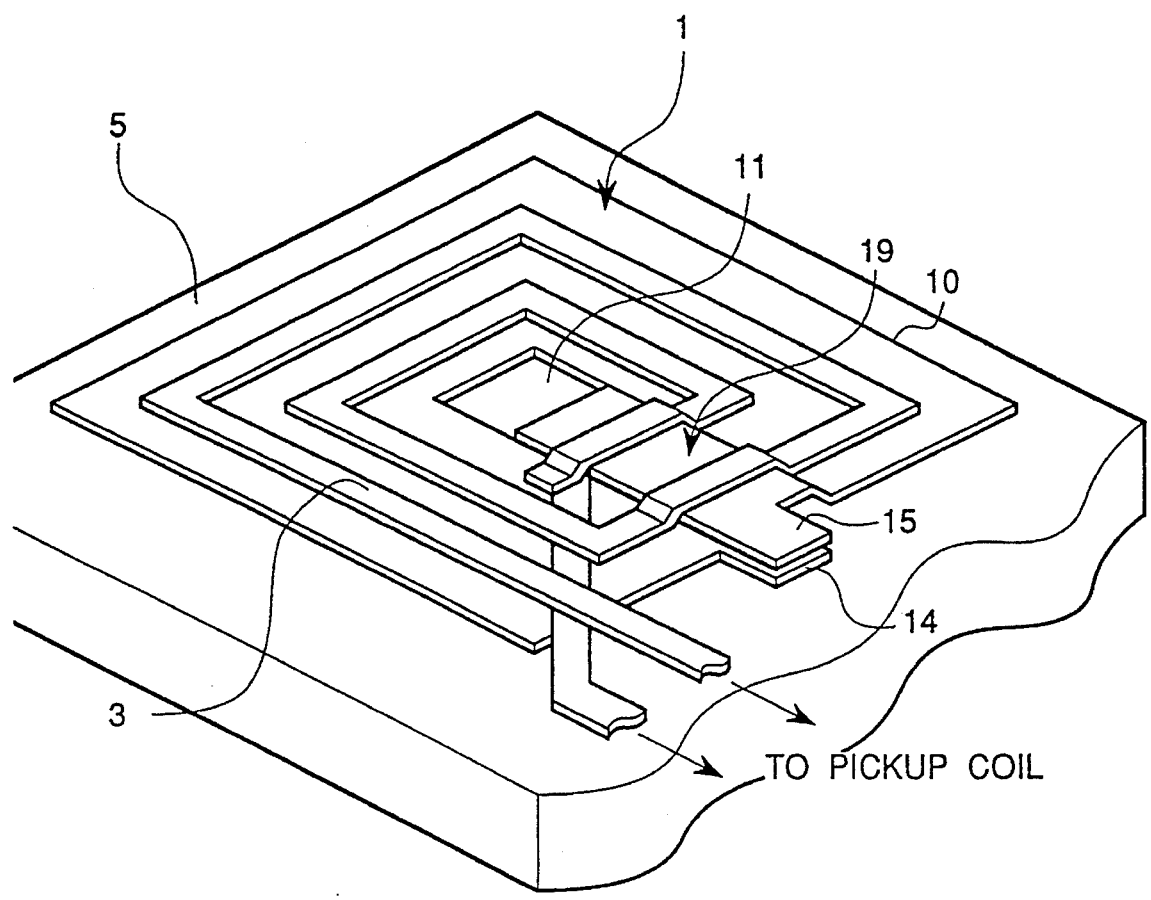
FIG. 1 is a partial schematic view a conventional planar magnetism sensor utilizing a SQUID.

The superconducting flux transformer 2 includes a rectangular input coil 3 arranged on the DC-SQUID 1 but isolated from it and a rectangular pickup coil 4 arranged on the substrate 5 far from the DC-SQUID 1. The superconducting flux transformer 2 is formed of a patterned c-axis orientated Y$_1$Ba$_2$Cu$_3$O$_{7-\delta}$ oxide superconductor thin film having a thickness of a few hundreds nanometers, for example 300 nanometers, and the input coil 3 and the pickup coil 4 are connected in parallel. The shapes of the input coil 3 and the pickup coil 4 are not limited to rectangles, and can be helical rectangular shapes, as shown in FIG. 1. The superconducting flux transformer concentrates the flux detected by the pickup coil into the input coil so that the DC-SQUID measures the concentrated flux.

Figure 2B:
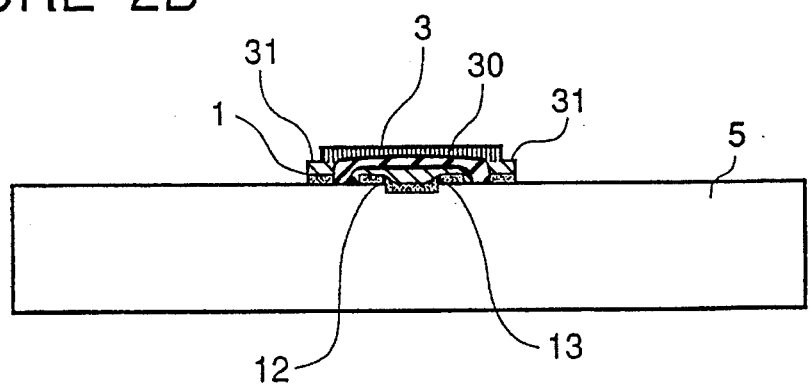
FIG. 2B is a diagrammatic sectional view taken on line A—A of FIG. 2A.

The magnetism shield 30 is also formed of a Y$_1$Ba$_2$Cu$_3$O$_{7-\delta}$ oxide superconductor thin film having a thickness of a few hundreds nanometers, for example 300 nanometers, which covers Josephson junctions of the DC-SQUID 1. FIG. 2B shows a diagrammatic sectional view taken on line A—A of FIG. 2A. In FIG. 2B, an insulating layer 31 of MgO is formed on the Josephson junctions 12 and 13 and the magnetism shield 30 is formed on the insulating layer 31. The magnetism shield 30 is isolated from the DC-SQUID 1. When the magnetism sensor is cooled and the Y$_1$Ba$_2$Cu$_3$O$_{7-\delta}$ oxide superconductor thin films of the DC-SQUID 1 and the superconducting flux transformer are in the superconducting state, the magnetism shield 30 of the Y$_1$Ba$_2$Cu$_3$O$_{7-\delta}$ oxide superconductor thin film is also in the superconducting state. Therefore, flux penetrating into the Josephson junctions 12 and 13 is excluded by the Meissner effect of the magnetic shield 30, so that the tunnel current flowing through the Josephson junctions 12 and 13 is not affected by the flux. By this, the magnetism sensor has a stable performance.

It can be considered that the magnetism shield 30 covers the input coil 3 and the entire SQUID 1. However, in order to stabilize the operation of the Josephson junctions 12 and 13 and increase output voltage of the SQUID 1, the magnetism shield 30 which covers the Josephson junctions 12 and 13 is sufficient.

The magnetism shield 30 may be formed of any material other than oxide superconductor, if flux penetrating into the Josephson junctions can be excluded.

Figure 3:
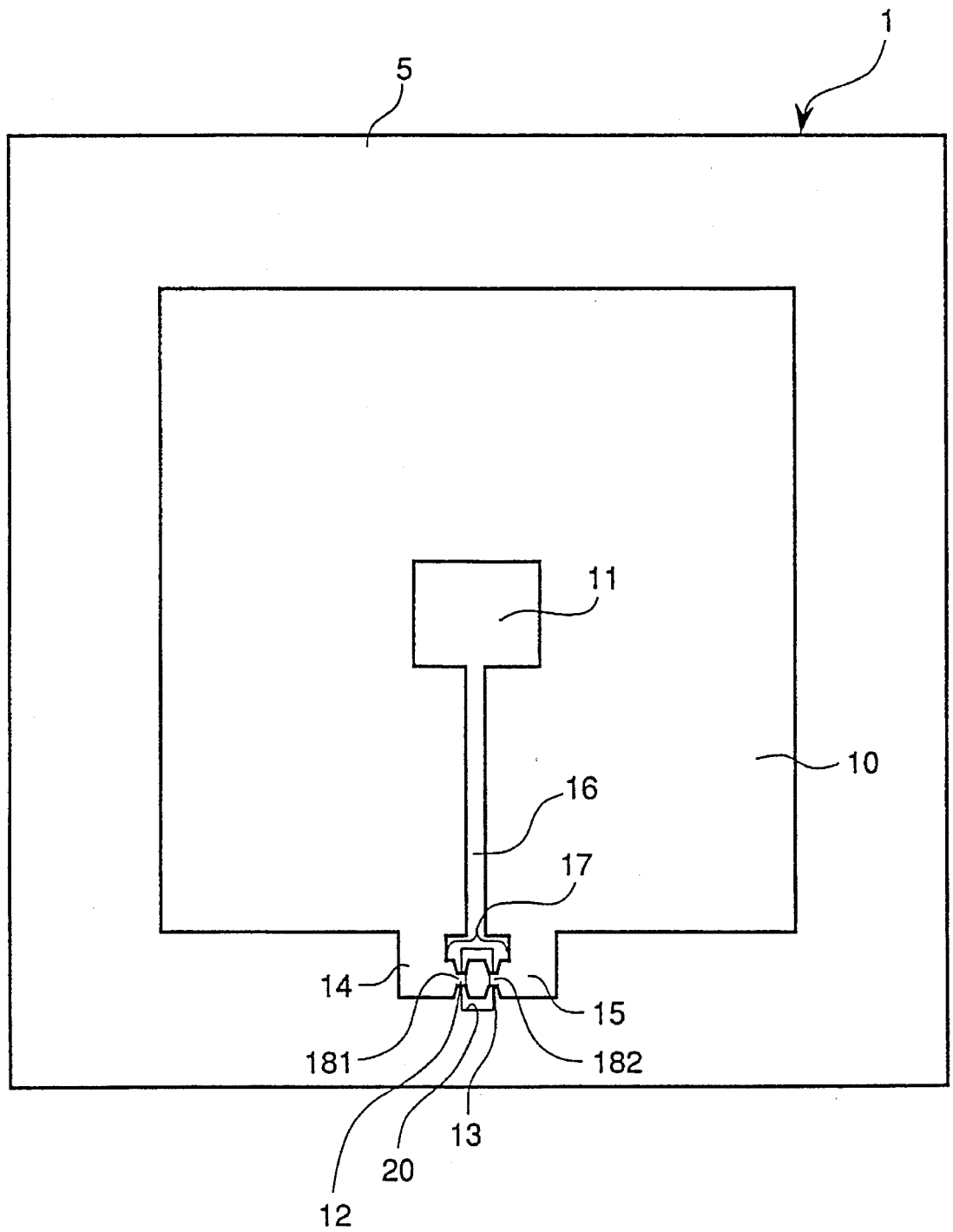
FIG. 3 is a diagrammatic plane view of the DC-SQUID which is used in the magnetism sensor shown in FIG. 2.

FIG. 3 shows a diagrammatic plan view of the DC-SQUID 1. In FIG. 3, the DC-SQUID 1 includes a washer 10 of a square shaped c-axis orientated Y$_1$Ba$_2$Cu$_3$O$_{7-\delta}$ oxide superconductor thin film formed on the substrate 5, at the center of which a square hole 11 is formed. The oxide superconductor thin film has a thickness of 500 nanometers.

The washer 10 has tongue portions 14 and 15 on its one side and a slit 16 formed between the tongue portions 14 and 15, which reaches the hole 11. The leading edges of the tongue portions 14 and 15 are connected by a member 17 of the oxide superconductor thin film, which has two bridge portions 181 and 182 at which Josephson junctions 12 and 13 of weak link type are respectively formed. In other words, the leading edges of the tongue portions 14 and 15 are connected through the Josephson junctions 12 and 13. The DC-SQUID 1 is connected to a signal processor (not shown) through the tongue portions 14 and 15.

Figure 4:
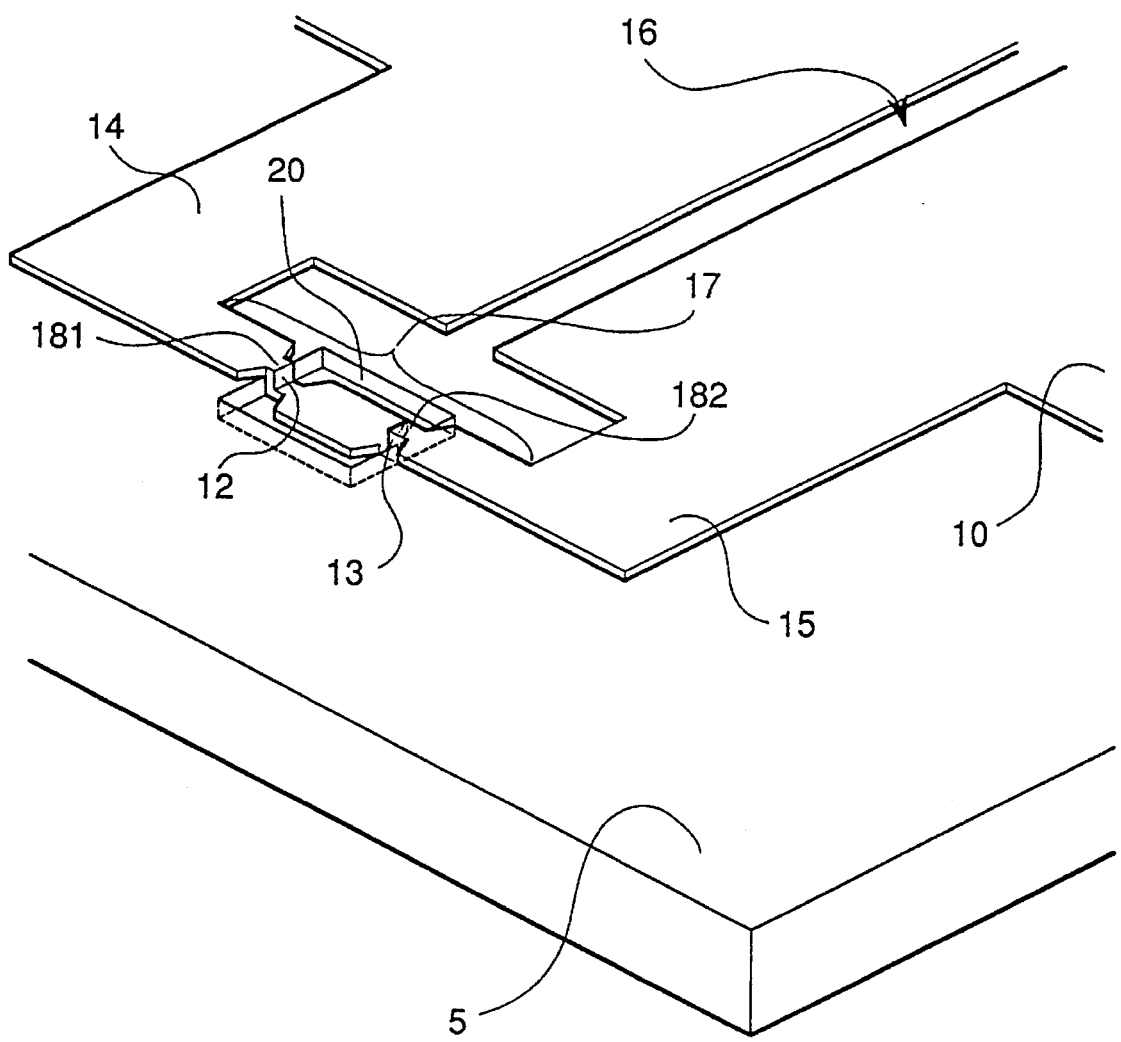
FIG. 4 is an enlarged detail of the DC-SQUID shown in FIG. 3.

FIG. 4 is an enlarged detail of a part of the DC-SQUID shown in FIG. 3. In FIG. 4, the member 17, the bridge portions 181 and 182, and the Josephson junctions 12 and 13 are shown in detail.

The member 17 connects the leading edges of the tongue portions 14 and 15, which has two bridge portions 181 and 182. A center portion of the member 17 is arranged at the bottom of a rectangular parallelpipedic concavity 20 of the substrate 2 and the bridge portions 181 and 182 are formed so as to cross the steps between the surface of the substrate 2 and the bottom of the concavity 20. The Josephson junctions 12 and 13 are formed at the bridge portions 181 and 182, which are constituted of grain boundaries of the oxide superconductor formed at the step portions.

The oxide superconductor thin film which constitutes the above magnetism sensor is preferably formed of a high-$T_c$ (high critical temperature) oxide superconductor material, particularly a high-$T_c$ copper-oxide type compound oxide superconductor material, for example, a Bi-Sr-Ca-Cu-O type compound oxide superconductor material, or a Tl-Ba-Ca-Cu-O type compound oxide superconductor material other than a Y-Ba-Cu-O type compound oxide superconductor material.

The above mentioned magnetism sensor was manufactured by the following process. At first, a c-axis orientated $Y_1Ba_2Cu_3O_{7-\delta}$ oxide superconductor thin film having a thickness of 500 nanometers was deposited by a high frequency magnetron sputtering process on a surface of an MgO (100) single crystal substrate 5 which had a concavity 20 on the surface. The conditions of the sputtering process were as follows;

| Temperature of substrate | 630° C. |
|---|---|
| Sputtering gases | |
| Ar | 8 sccm |
| $O_2$ | 4 sccm |
| Pressure | $5 \times 10^{-2}$ Torr |

The oxide superconductor thin film was formed in such a manner that the concavity 20 was covered with the oxide superconductor thin film near the center of one side of the oxide superconductor thin film. Grain boundaries were generated in the oxide superconductor thin film at the steps between the surface of the substrate and the bottom of the concavity, which constituted weak links of Josephson junctions.

Then, the oxide superconductor thin film was etched by an ion milling using Ar-ions so that a square washer 10 and a projecting portion on one side, which covered the concavity 20 and would be shaped into the tongue portions 14 and 15.

Thereafter, by an ion milling using Ar-ions, a square hole 11 was formed at the center of the washer and a member 17 was formed at the edge of the projecting portion on the concavity 20 in such a manner that the member 17 had narrow bridge portions 181 and 182 crossing the steps at which grain boundaries had been formed.

After then, a slit 16 which divided the projecting portion into two tongue portions 14 and 15 was formed to the hole 11. By this, the DC-SQUID was completed.

Thereafter, an MgO thin film is deposited on the DC-SQUID 1 by a vacuum evaporation. The MgO thin film was formed so as to have an enough thickness for constituting an insulating layer, for example 100 nanometers.

Then, a c-axis orientated $Y_1Ba_2Cu_3O_{7-\delta}$ oxide superconductor thin film having a thickness of 300 nanometers was deposited on the MgO thin film and the substrate 5, and the oxide superconductor was processed into the superconducting flux transformer 2 and the magnetism shield 30.

By this, the embodiment of the magnetism sensor in accordance with the present invention was completed.

By using the above mentioned magnetism sensor in accordance with the present invention and a conventional magnetism sensor which did not have a magnetism shield on the Josephson junctions of the DC-SQUID, a faint magnetic field was measured while the magnetism sensors were chilled by liquid nitrogen. The magnetism sensor in accordance with the present invention had a $dV/d\phi$ of 20 $\mu v/\phi_i$ and a magnetic field sensitivity of $5 \times 10^{-5}$ $\phi_O/(Hz)^{1/2}$ at 1 Hz. On the other hand, the conventional magnetism sensor had a $dV/d\phi$ of 10 $\mu v/\phi_i$ and a magnetic field sensitivity of $1 \times 10^{-4}$ $\phi_O/(Hz)^{1/2}$ at 1 Hz. Thus, the magnetism sensor in accordance with the present invention had twice output voltage and twice magnetic field sensitivity of the conventional one.

As explained above, the above mentioned magnetism sensor in accordance with the present invention has an improved output voltage and sensitivity. This high sensitivity is realized by a magnetism shield which excludes flux penetrating into the Josephson junction of the SQUID. In addition, if the magnetism sensor is manufactured in accordance with the above mentioned process, the limitation in the fine processing technique required for manufacturing the magnetism sensor is relaxed. In the above process, of course, the film deposition process of the oxide superconductor is not limited to a high frequency magnetron sputtering process, but any film deposition process such as an MBE (Molecular Beam Epitaxy), a laser ablation, a vacuum evaporation can be employed, so long as a high quality oxide superconductor thin film can be deposited.

The invention has thus been shown and described with reference to the specific embodiments. However, it should be noted that the present invention is in no way limited to the details of the illustrated structures but converts and modifications may be made within the scope of the appended claims.

We claim:

1. A magnetic sensor comprising:

(A) a substrate;

(B) a SQUID;

(C) a superconducting flux transformer of an oxide superconductor thin film; and (D) a magnetic shield;

wherein said SQUID comprises:

(B1) a washer of an oxide superconductor thin film formed on a principal surface of the substrate;

(B2) a hole at the center of the washer that has a shape similar to the washer;

(B3) a slit formed between one side of the washer and the hole; and (B4) at least one Josephson junction by which portions of the washer at each side of the slit are connected across the slit;

wherein said superconducting flux transformer comprises:

(C1) an input coil arranged on the SQUID but isolated from the SQUID; and (C2) a pickup coil arranged on the principal surface of the substrate far from the SQUID, the pickup coil and the input coil being connected in parallel so that magnetic flux that penetrates the pickup Soil is transferred to the input coil so that the magnetic flux penetrates the SQUID; and wherein said magnetic shield covers the Josephson junction of the SQUID to exclude flux from the input coil from penetrating into the Josephson junction of the SQUID.

2. A magnetic sensor claimed in claim 1 wherein the magnetic shield is formed of an oxide superconductor thin film.

3. A magnetic sensor claimed in claims 1 wherein the washer and the hole of the SQUID are rectangular.

4. A magnetic sensor claimed in claim 3 wherein the input coil and the pickup coil of the superconducting flux transformer are rectangular.

5. A magnetic sensor claimed in claim 1 wherein the Josephson junction of the SQUID is constituted of a grain boundary of the oxide superconductor.

6. A magnetic sensor claimed in claim 1 wherein the SQUID includes two Josephson junctions so as to constitute a DC-SQUID.

7. A magnetic sensor claimed in claim 1 wherein the oxide superconductor thin films are formed of a high-$T_c$ (high critical temperature) oxide superconductor.

8. A magnetic sensor claimed in claim 7 wherein the oxide superconductor thin films are formed of an oxide superconductor material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

9. A magnetic sensor claimed in claim 1 wherein the substrate is formed of a material selected from the group consisting of a MgO (100) substrate, a SrTiO$_3$ (100) substrate and an yttrium stabilized zirconia (YSZ) substrate.

10. A magnetic sensor comprising:

a substrate that has a rectangular parallelpipedic concavity on a surface;

a SQUID that includes a square washer of an oxide superconductor thin film formed on the surface of the substrate, a tongue portion that extends on one Side of the washer, a square hole at a center of the washer, a slit formed in the tongue portion to the hole to separate the tongue portion into two parts, and a member of an oxide superconductor thin film that includes two Josephson junctions connected in series, which connects the two parts of the tongue portion across the slit, wherein the Josephson junctions of the SQUID are constituted of grain boundaries of the oxide superconductor thin film at steps between the surface of the substrate and a bottom of the concavity;

a superconducting flux transformer of an oxide superconductor thin film that includes a rectangular input coil arranged on the SQUID but isolated from the SQUID and a rectangular pickup coil arranged on the surface of the substrate far from the SQUID, the input coil and the pickup coil being connected in parallel; and a magnetic shield that covers the Josephson junctions of the SQUID to exclude flux from the input coil from penetrating into the Josephson junction of the SQUID.

11. A magnetic sensor claimed in claim 7, wherein the oxide superconductor thin films are formed of a high-$T_c$ copper-oxide type compound oxide superconductor.

* * * * *